United States Patent
Kuroda

[11] Patent Number: 5,825,059
[45] Date of Patent: Oct. 20, 1998

[54] SEMICONDUCTOR DEVICE AND AN INTERCONNECTION STRUCTURE OF SAME

[75] Inventor: Hideaki Kuroda, Kanagawa, Japan

[73] Assignee: Sony Corporation, Tokyo, Japan

[21] Appl. No.: 791,271

[22] Filed: Jan. 30, 1997

[30] Foreign Application Priority Data

Feb. 2, 1996 [JP] Japan ................................. 8-040441

[51] Int. Cl.[6] .................... H01L 29/76; H01L 27/108; H01L 29/94; H01L 31/119
[52] U.S. Cl. ..................... 257/301; 257/303; 257/304; 257/305; 257/385; 257/774
[58] Field of Search .................. 257/301–305, 257/411, 774, 520, 385; 435/243–248; 438/386

[56] References Cited

U.S. PATENT DOCUMENTS

| | | | |
|---|---|---|---|
| 5,166,762 | 11/1992 | Yoshida | 257/302 |
| 5,262,846 | 11/1993 | Gill et al. | 257/314 |
| 5,281,548 | 1/1994 | Prall | 257/315 |
| 5,336,917 | 8/1994 | Kohyama | 257/301 |
| 5,396,093 | 3/1995 | Lu | 257/302 |
| 5,498,889 | 3/1996 | Hayden | 257/301 |
| 5,563,762 | 10/1996 | Leung et al. | 257/303 |
| 5,578,848 | 11/1996 | Kwong et al. | 257/411 |
| 5,583,360 | 12/1996 | Roth et al. | 257/315 |
| 5,604,659 | 2/1997 | Madan | 257/304 |
| 5,608,248 | 3/1997 | Ohno | 257/304 |
| 5,616,960 | 4/1997 | Noda et al. | 257/774 |

Primary Examiner—Mahshid D. Saadat
Assistant Examiner—Jhihan B. Clark
Attorney, Agent, or Firm—Hill & Simpson

[57] ABSTRACT

A connection hole of a semiconductor device having a structure of preventing the connection hole from being short-circuited or degraded in dielectric strength even if there occurs misalignment when an opening portion is formed in an interlayer insulating film at a position over a conductive layer for forming the opening portion. The connection hole includes an inner wall on which an insulating film protected by a side wall made from non-crystal silicon is formed.

8 Claims, 14 Drawing Sheets

[STEP-160]

[STEP-100]

[STEP-110]

[STEP-120]

[STEP-130]

[STEP-140]

[STEP-150]

[STEP-280]

[STEP-200]

[STEP-210]

[STEP-210] CONTINUED

[STEP-220]

[STEP-230]

[STEP-240]

[STEP-250]

[STEP-250] CONTINUED

[STEP-260]

[STEP-270]

[STEP-10]

[STEP-20]

[STEP-30]

[STEP-30] CONTINUED

F I G. 14
[STEP-40]
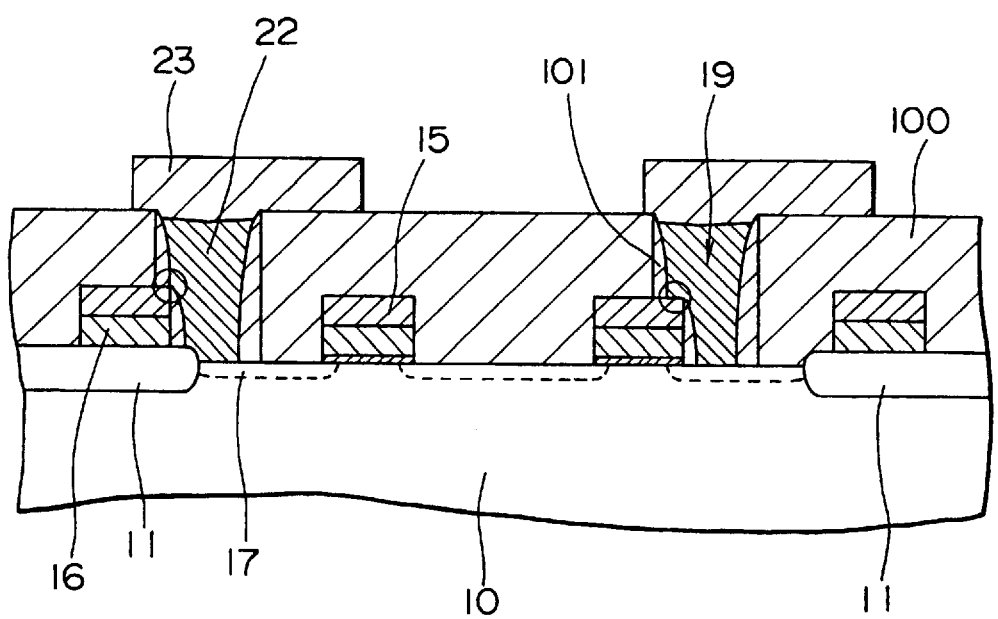

SEMICONDUCTOR DEVICE AND AN INTERCONNECTION STRUCTURE OF SAME

BACKGROUND OF THE INVENTION

The present invention relates to a structure of connection hole (including a contact hole, via hole, and through hole; the same shall apply hereinafter) of a semiconductor device, and a formation method thereof; an interconnection structure of a semiconductor device having such a connection hole; and a semiconductor device having such an interconnection structure.

In general, a semiconductor device has a large number of connection holes for electrically connecting a lower conductive layer (interconnection layer) to an upper conductive layer (interconnection layer) formed on an interlayer insulating film covering the lower conductive layer. In this case, if the connection hole needs to be electrically insulated from a conductive layer or a capacitor insulating film formed in the interlayer insulating film, a side wall made from an insulating material must be formed on the inner wall of the connection hole. Hereinafter, a related art method of forming such a connection hole will be described with reference to FIGS. 12A and 12B, 13A and 13B, and 14.

[Step-10]

An element isolation region 11, for example, having a LOCOS (Local Oxidation of Silicon) structure is formed on a semiconducting substrate 10 made from silicon by a known process, and a gate oxide film 12 is formed by oxidation of the surface of the semiconducting substrate 10. Next, a polycrystalline silicon layer 13 doped with an impurity is formed over the entire surface, and a silicide layer 14 made from, for example, tungsten silicide is formed over the entire surface. A gate electrode 15 having a polycide structure is formed by etching the silicide layer 14 and the polycrystalline silicon layer 13. An interconnection layer 16 having a double layer structure of the polycrystalline silicon layer 13 and the silicide layer 14 is also formed on the element isolation region 11. A diffusion layer 17 is then formed by ion implantation of an impurity in the semiconducting substrate 10. FIG. 12A is a schematic, partial sectional view illustrating such a structure.

[Step-20]

After that, for example, a first interlayer insulating film, a conductive layer, and a second interlayer insulating film are sequentially formed over the entire surface. An opening portion 19 is then formed in the second interlayer insulating film, conductive layer and first interlayer insulating film at a position over the diffusion layer 17. FIG. 12B is a schematic, partial sectional view illustrating such a structure. In addition, the first interlayer insulating film, conductive layer and the second interlayer insulating film are represented by one layer for a clearer understanding, which is indicated by reference numeral 100.

[Step-30]

An insulating film 101 made from $SiO_2$ is formed on the second interlayer insulating film including the interior of the opening portion 19 (see FIG. 13A). The insulating film 101 is anisotropically etched, to form a side wall made of the insulating film 101 on the inner wall of the opening portion 19 (see FIG. 13B).

[Step-40]

The interior of the opening portion 19 is buried with a conductive material (for example, polycrystalline silicon doped with an impurity), to form a contact plug 22. The connection hole is thus formed. Next, an upper interconnection layer 23 is formed on the second interlayer insulating film (see FIG. 14). The contact plug 22 is electrically insulated from the conductive layer (not shown) by means of the side wall formed of the insulating film 101.

The above-described related art method has the following problems. When there occurs misalignment in formation of the opening portion 19 at Step-20, the gate electrode 15 and the interconnection layer 16 possibly project in the opening portion 19 as shown in FIG. 12B. As a result of such a phenomenon, the shoulder portions of the gate electrode 15 and the interconnection layer 16 are exposed as shown by a region surrounded by a circle in FIG. 13B, which leads to short-circuit between the contact plug 22 and the gate electrode 15 and the interconnection layer 16 as shown in FIG. 14.

Alternatively, the side wall becomes thin at the shoulder portions of the gate electrode 15 and the interconnection layer 16, and it is possibly steppedly cut at a cleaning step or hydrofluoric acid treatment step after formation of the opening portion 19. This leads to short-circuit between the contact plug 22 and the gate electrode 15 and the interconnection layer 16 or degradation of dielectric strength therebetween as shown in FIG. 14.

SUMMARY OF THE INVENTION

An object of the present invention is to provide a connection hole of a semiconductor device having a structure of preventing the connection hole from being short-circuited or degraded in dielectric strength even if there occurs misalignment when an opening portion is formed in an interlayer insulating film at a position over a conductive layer for forming the opening portion, and a method of forming such a connection hole; to provide an interconnection structure of a semiconductor device having such a connection hole; and to provide a semiconductor device having such a connection hole.

To achieve the above object, according to a first aspect of the present invention, there is provided a connection hole of a semiconductor device, including an inner wall on which an insulating film protected by a side wall made from non-crystal silicon is formed.

According to a second aspect of the present invention, there is provided a method of forming a connection hole of a semiconductor device, including the steps of:

forming an interlayer insulating film on a base having a conductive layer, and forming an opening portion in the interlayer insulating film at a position over the conductive layer;

forming an insulating film over the entire surface including the interior of the opening portion, and forming a non-crystal silicon layer on the insulating film;

etching the non-crystal silicon layer and the insulating film which are positioned on the interlayer insulating film and on the bottom portion of the opening portion, to form a side wall formed of the non-crystal silicon layer on the insulating film covering the inner wall of the opening portion; and burying the interior of the opening portion with a conductive material.

According to a third aspect of the present invention, there is provided an interconnection structure of a semiconductor device, including:

a conductive layer formed on a base;

an interlayer insulating film formed on the conductive layer;

a connection hole formed in the interlayer insulating film at a position over the conductive layer; and an upper interconnection layer formed on the interlayer insulating film and connected to the connection hole;

wherein an insulating film protected by a side wall made from non-crystal silicon is formed on the inner wall of the connection hole.

According to a fourth aspect of the present invention, there is provided a semiconductor device including:

a conductive layer formed on a base;

an interlayer insulating film formed on the conductive layer;

a connection hole formed in the interlayer insulating film at a position over the conductive layer;

a storage electrode formed at a position over the interlayer insulating film and connected to the connection hole;

a capacitor insulating film formed on the storage electrode; and a plate electrode formed on the capacitor insulating film;

wherein an insulating film protected by a side wall made from non-crystal silicon is formed on the inner wall of the connection hole.

In each of the above configurations, the insulating film is preferably a double layer structure of a SiN layer and a $SiO_2$ layer.

In the present invention, non crystal silicon means amorphous silicon or polycrystalline silicon, and the base having a conductive layer is represented by a semiconducting substrate having a diffusion layer such as a source/drain region or an insulating layer on which a lower interconnection layer is formed.

According to the present invention in which an insulating film protected by a side wall made from non-crystal silicon is formed on the inner wall of a connection hole, even if there occurs misalignment when an opening portion is formed in an interlayer insulating film, there can be prevented exposure of shoulder portions of a gate electrode and the like leading to short-circuit between the connection hole and the gate electrode and the like. Also, since the insulating film formed on the inner wall of the connection hole is protected by the side wall made from non-crystal silicon, it is possible to prevent occurrence of damages of the insulating film at a cleaning step or a hydrofluoric acid treatment step after formation of the opening portion, and hence to prevent short-circuit between the connection hole and the gate electrode and the like and degradation of dielectric strength therebetween.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 12A and 12B, FIGS. 13A and 13B, and FIG. 14 are schematic, partial sectional views of a semiconducting substrate and the like, illustrating a related art fabrication process of a semiconductor device.

DETAILED DESCRIPTION OF THE PREFERRED EMBODIMENTS

Hereinafter, preferred embodiments of the present invention will be described in detail with reference to the drawings.

Embodiment 1

This embodiment concerns a connection hole of a semiconductor device and a formation method thereof, and an interconnection structure of a semiconductor device according to the present invention. In this embodiment, a connection hole is formed for connecting a diffusion layer 17 (as a conductive layer) formed in a semiconductor substrate 10 (as a base) made from silicon to an upper interconnection layer 23 formed at a position over the conductive layer 17. An insulating film 20 having a double layer structure of a SiN layer and a $SiO_2$ layer and protected by a side wall 21A of non-crystal silicon (concretely, polycrystalline silicon) is formed on the inner wall of the connection hole.

Figure 1:
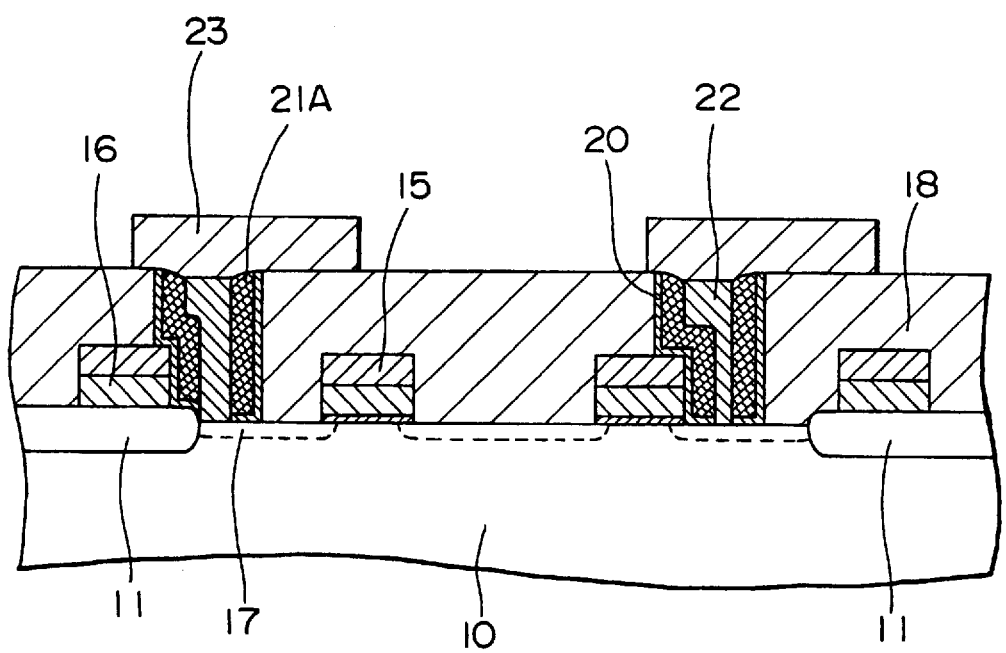
FIG. 1 is a schematic, partial sectional view of a semiconductor device in Embodiment 1.

An interconnection structure of a semiconductor device in this embodiment includes, as shown in FIG. 1, the diffusion layer 17 (as a conductive layer) formed in the semiconducting substrate 10 (as a base) made from silicon, an interlayer insulating film 18 formed on the diffusion layer 17, a connection hole formed in the interlayer insulating film 18 at a position over the diffusion layer 17, and an upper interconnection layer 23 formed on the interlayer insulating film 18 and connected to the connection hole. The connection hole is buried with a contact plug 22 made from polycrystalline silicon.

Hereinafter, this embodiment will be described with reference to FIG. 1, FIGS. 2A and 2B, FIGS. 3A and 3B, and FIGS. 4A and 4B which are schematic, partial sectional views of a semiconducting substrate and the like, illustrating a fabrication process of a semiconductor device in accordance with this embodiment.

[Step-100]

Figure 2A:
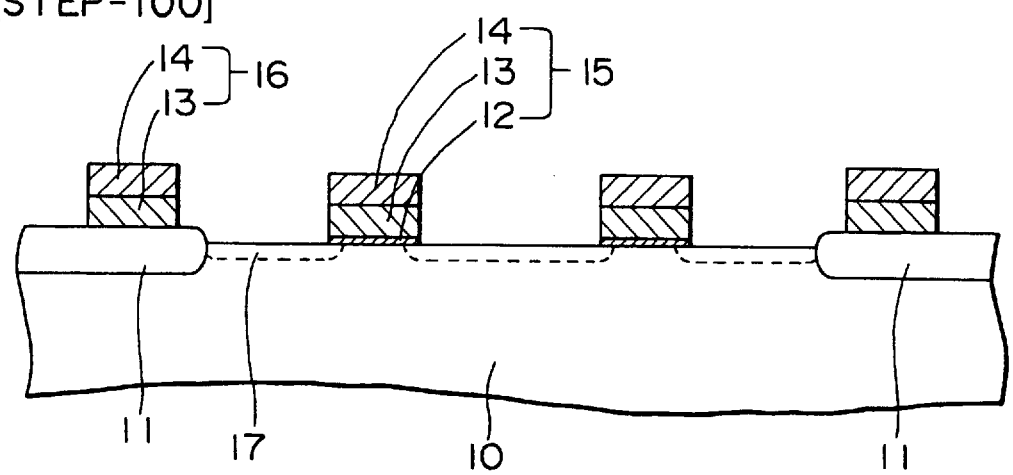
FIGS. 2A and 2B, FIG. 3A and 3B, and FIGS. 4A and 4B are schematic, partial sectional views of a semiconducting substrate and the like, illustrating a fabrication process of the semiconductor device in Embodiment 1.

An element isolation region 11 having a LOCOS structure is formed in a semiconducting substrate 10 made from silicon by a known process, and a gate oxide film 12 is formed by oxidation of the surface of the semiconducting substrate 10. The element isolation region 11 may include a trench structure. A polycrystalline silicon layer 13 doped with an impurity is formed over the entire surface, and a silicide layer 14 made from tungsten silicide is then formed over the entire surface. The silicide layer 14 and the polycrystalline silicon layer 13 are patterned by photolithography and etching, to form a gate electrode 15 having a polycide structure. In addition, an interconnection layer 16 having a double layer structure of the polycrystalline silicon layer 13 and the silicide layer 14 is additionally formed on the element isolation region 11, as required. After that, a diffusion layer 17 is formed by ion implantation of an impurity in the semiconducting substrate 10. Such a structure is shown in FIG. 2A.

[Step-110]

Figure 2B:
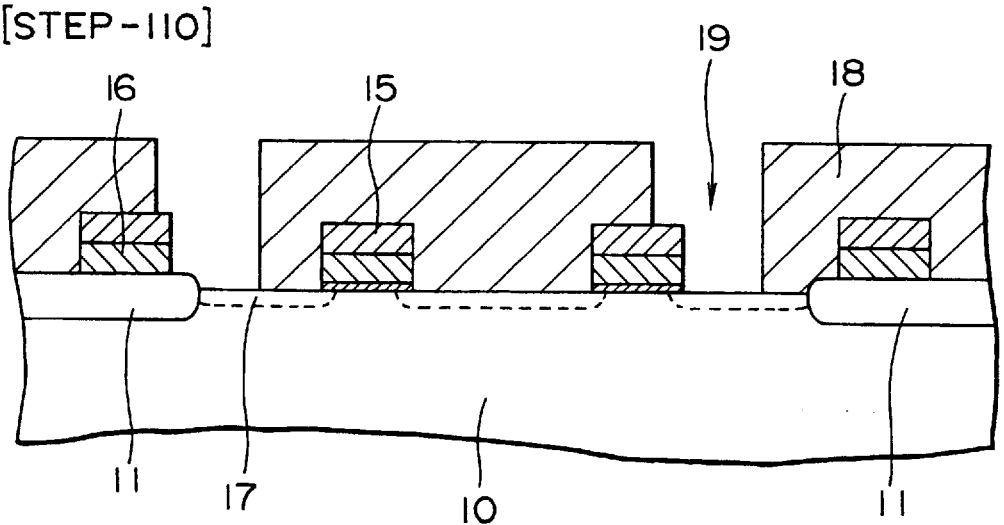

An interlayer insulating film 18 made from $SiO_2$ is formed by CVD (Chemical Vapor Deposition) on the semiconducting substrate 10 (as the base) at a region in which the diffusion layer 17 (as the conductive layer) is formed, and an opening portion 19 is formed in the interlayer insulating film 18 at a position over the diffusion layer 17 by RIE (Reactive Ion Etching). Such a structure is shown in FIG. 2B. FIG. 2 illustrate a state in which there occurs misalignment. In addition, a first interlayer insulating film, a conductive film and a second interlayer insulating film may be sequentially formed in place of formation of the interlayer insulating film 18.

[Step-120]

Figure 3A:
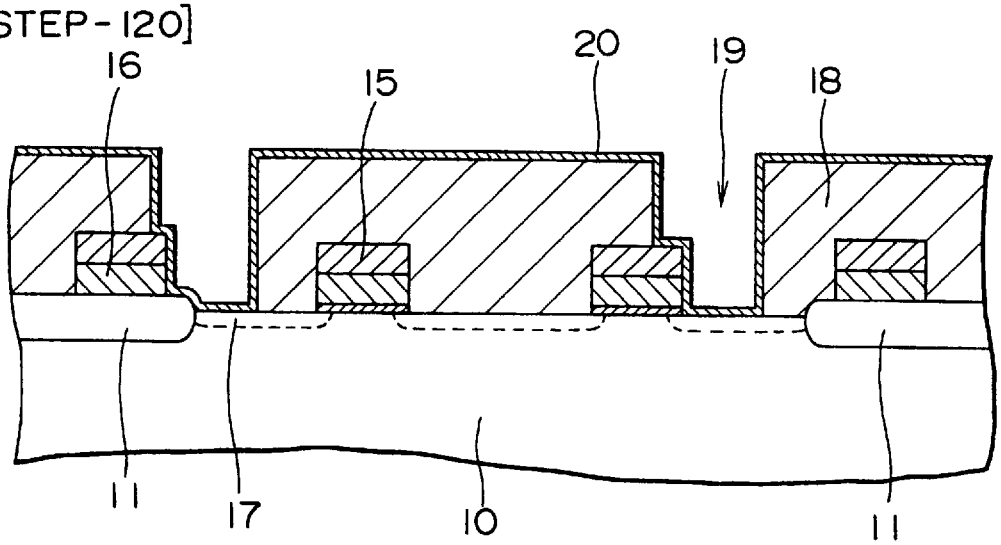

After that, a SiN layer is formed on the interlayer insulating film 18 including the interior of the opening portion 19 by CVD and a SiO$_2$ layer is formed on the SiN layer by CVD. Thus, an insulating film 20 is formed over the entire surface including the interior of the opening portion 19. Such a structure is shown in FIG. 3A. In this figure, the insulating layer 20 having a double layer structure of the SiN layer and the SiO$_2$ layer is represented by one layer for a clearer understanding. The insulating film 20 may be a SiO$_2$ single layer, SiN single layer or a SiON single layer; or a polycrystalline silicon layer or an amorphous silicon layer which is oxidized on its surface after being deposited.

Film Formation Condition of SiN layer process gas: SiH$_2$Cl$_2$/NH$_3$=70/700 sccm (standard cubic centimeters/minute)

film formation temperature: 760° C.

pressure: 73.3 Pa film thickness; 20 nm

Film Formation Condition of SiO$_2$ Layer process gas: TEOS=90 sccm film formation temperature: 690° C.

pressure: 107 Pa film thickness: 20 nm

[Step-130]

Figure 3B:
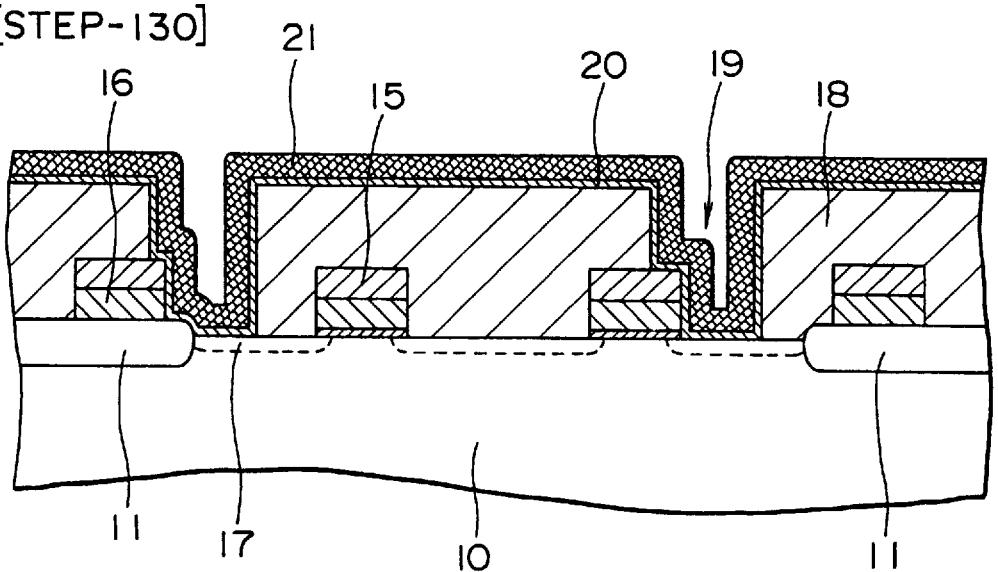

Next, a non-crystal silicon layer (polycrystalline silicon layer in this embodiment) 21 is formed on the insulating film 20 by CVD in the following condition. Such a structure is shown in FIG. 3B. In addition, the non-crystal silicon layer 21 is not necessarily doped with an impurity; however, it is desirable to be doped with an impurity.

Film Formation Condition of Non-crystal Silicon Layer process gas: PH$_3$/SiH$_4$=35/465 sccm film formation temperature: 530° C.

film thickness: 100 nm

[Step-140]

Figure 4A:
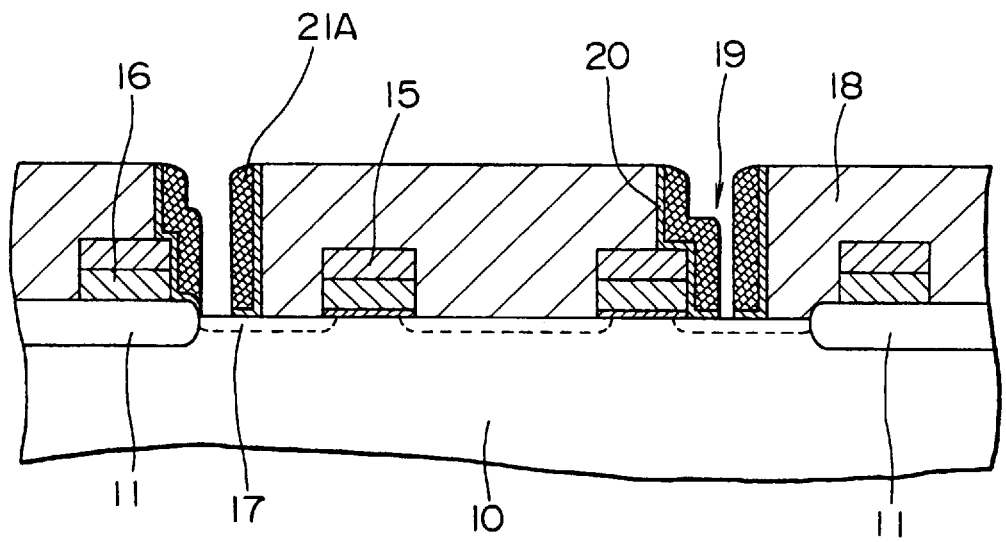

The non-crystal silicon layer 21 and the insulating film 20 positioned on the interlayer insulating film 18 and on the bottom portion of the opening portion 19 are anisotropically etched using a HBr/Cl$_2$ based etching gas, to form a side wall 21A made from non-crystal silicon on the insulating film 20 covering the inner wall of the opening portion 19. Since the insulating film 20 covering the inner wall of the opening portion 19 is covered with the side wall 21A made from non-crystal silicon, it is not exposed to the etching gas. Moreover, the insulating film 20 on the bottom portion of the opening portion 19 is etched with the side wall 21A taken as a mask. Such a structure is shown in FIG. 4A. In addition, if the surface of the non-crystal silicon layer 21 is oxidized before etching to form a SiO$_2$ film on the surface of the non-crystal silicon layer 21, the non-crystal silicon layer 21 on the inner wall of the opening portion 19 becomes hard to be etched. This is effective to more positively form the side wall 21A.

[Step-150]

Figure 4B:
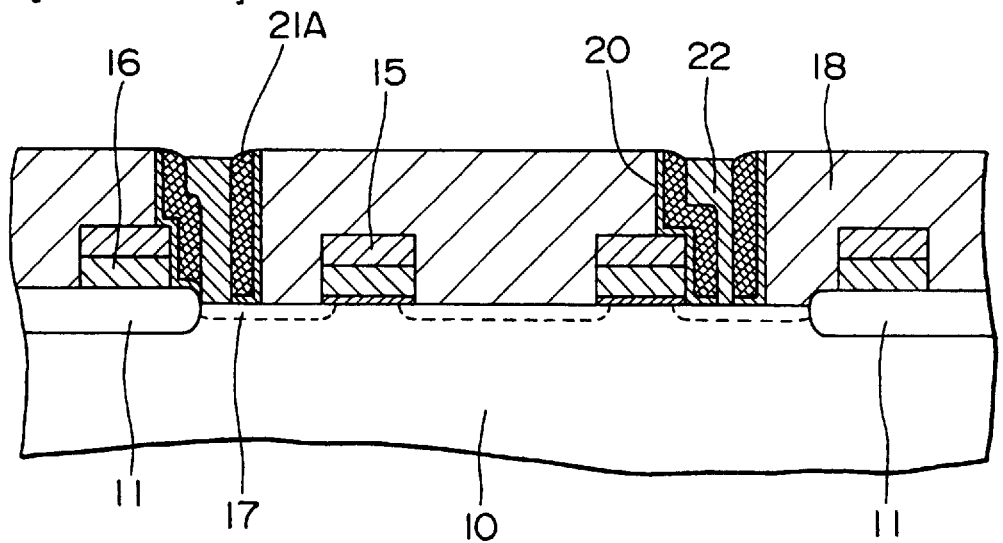

A polycrystalline silicon layer doped with an impurity is deposited by CVD on the interlayer insulating film 18 including the interior of the opening portion 19, to bury the interior of the opening portion 19 with the polycrystalline silicon as a conductive material. In some cases, a natural oxide film formed on the surface of the semiconducting substrate 10 exposed at the bottom portion of the opening portion 19 is removed by hydrofluoric acid. In this case, the insulating film 20 covered with the side wall 21A can be prevented from being damaged by hydrofluoric acid. After that, the polycrystalline silicon layer on the interlayer insulating film 18 is removed by etching-back over the entire surface. Thus, the interior of the opening portion 19 is buried with a contact plug 22 made from polycrystalline silicon, to form a connection hole. Such a structure is shown in FIG. 4B.

The contact plug 22 may be made from a high melting point metal in place of polycrystalline silicon. In this case, the contact plug may be formed by a so-called blanket tungsten CVD process. In this blanket tungsten CVD, a Ti layer and a TiN layer are sequentially formed by sputtering over the entire surface including the interior of the opening portion 19. The reason why the Ti layer and the TiN layer are formed is to obtain a low ohmic resistance, to prevent occurrence of damages on the semiconducting substrate 10 upon deposition of tungsten by CVD, and to improve adhesiveness of tungsten. In addition, only one of the Ti layer and the TiN layer may be formed. The sputtering conditions of the Ti layer and the TiN layer are as follows.

Ti Layer (thickness: 30 nm)

process gas: Ar=100 sccm pressure; 0.4 Pa

DC power: 5 kW substrate heating temperature: 150° C.

TiN Layer (thickness: 70 nm)

process gas: N$_2$/Ar=80/30 sccm pressure: 0.4 Pa

DC power: 5 kW substrate heating temperature: 150° C.

The TiN layer thus formed is preferably annealed in the following condition for improving a barrier characteristic thereof.

atmosphere: 100% of nitrogen gas temperature: 450° C.

time: 30 min

After that, a conductive layer made from tungsten is formed on the TiN layer by blanket tungsten CVD in the following condition.

process gas: WF$_6$/H$_2$/Ar=75/500/2800 sccm pressure: $1.06 \times 10^4$ Pa film formation temperature: 450° C.

Next, the conductive layer made from tungsten, TiN layer, and Ti layer are etched-back, to bury the interior of the opening portion with a contact plug made from tungsten, thus forming a connection hole. The etch-back condition is as follows.

process gas: SF$_6$/Cl$_2$=25/20 sccm pressure: 1 Pa microwave power: 950 W

RF power: 50 W (2 MHz)

[Step-160]

After that, for example, a Ti layer for improving wettability, and an interconnection layer made from Al-0.5%

Cu are formed over the entire surface by sputtering, followed by patterning by etching, to form an upper layer interconnection layer 23. Such a structure is shown in FIG. 1. In addition, the upper interconnection layer 23 is represented by one layer for a clearer understanding.

Film Formation Condition of Ti Layer process gas: Ar=100 sccm pressure: 0.4 Pa

DC power: 5 kW substrate heating temperature: 150° C.

film thickness: 30 nm

Film Formation Condition of Interconnection Layer target: Al-0.5%Cu process gas: Ar=100 sccm pressure: 0.4 Pa DC power: 5 kW substrate heating temperature: 300° C.

The opening portion 19 may be buried with an interconnection layer in place of formation of a contact plug made from polycrystalline silicon in the opening portion 19. In this case, to positively bury the opening portion 19 with an interconnection layer, a Ti layer is first deposited by sputtering on the interlayer insulating film 18 including the interior of the opening portion 19 for reducing a contact resistance and improving wettability, and then a TiN layer as a barrier layer is formed by sputtering thereon. After that, a contact plug made of an aluminum alloy may be formed in the opening portion 19 using a so-called high temperature aluminum sputtering process, an aluminum reflow process, or a high pressure aluminum reflow process. The high temperature aluminum process is performed by setting the substrate heating temperature in the above film formation conditions at about 500° C. for allowing an aluminum alloy deposited on the interlayer insulating film 18 to flow in the opening portion 19. The aluminum reflow process is performed by setting the substrate heating temperature in the above film formation conditions at about 150° C. and depositing an aluminum alloy on the interlayer insulating film 18, and then heating the substrate at about 500° C. for allowing the aluminum alloy deposited on the interlayer insulating film 18 to flow in the opening portion 19. The high pressure aluminum reflow process is performed by depositing an aluminum alloy on the interlayer insulating film 18 at about 150° C., and heating the substrate at about 500° C. in a high pressure atmosphere of about $10^6$ Pa for allowing the aluminum alloy deposited on the interlayer insulating film 18 to flow in the opening portion 19.

The above-described processing steps are followed by known steps, to accomplish a semiconductor device according to the present invention.

Embodiment 2

This embodiment concerns a connection hole of a semiconductor device and a formation method thereof; and a semiconductor device having such a connection hole. More specifically, the semiconductor device in this embodiment is a stacked DRAM semiconductor device in which a storage electrode (storing node electrode) of a capacitor has a cylindrical shape. In this embodiment, a connection hole is formed for connecting a diffusion layer (as a conductive layer) 17 formed in a semiconducting substrate (as a base) 10 made from silicon to a storage electrode (storing node electrode) formed at a position over the diffusion layer 17. Like the previous embodiment, an insulating film 20 having a double layer structure of a SiN layer and a SiO$_2$ layer and protected by a side wall 21A made from non-crystal silicon (concretely, polycrystalline silicon) is formed on the inner wall of the connection hole in this embodiment.

Figure 5:
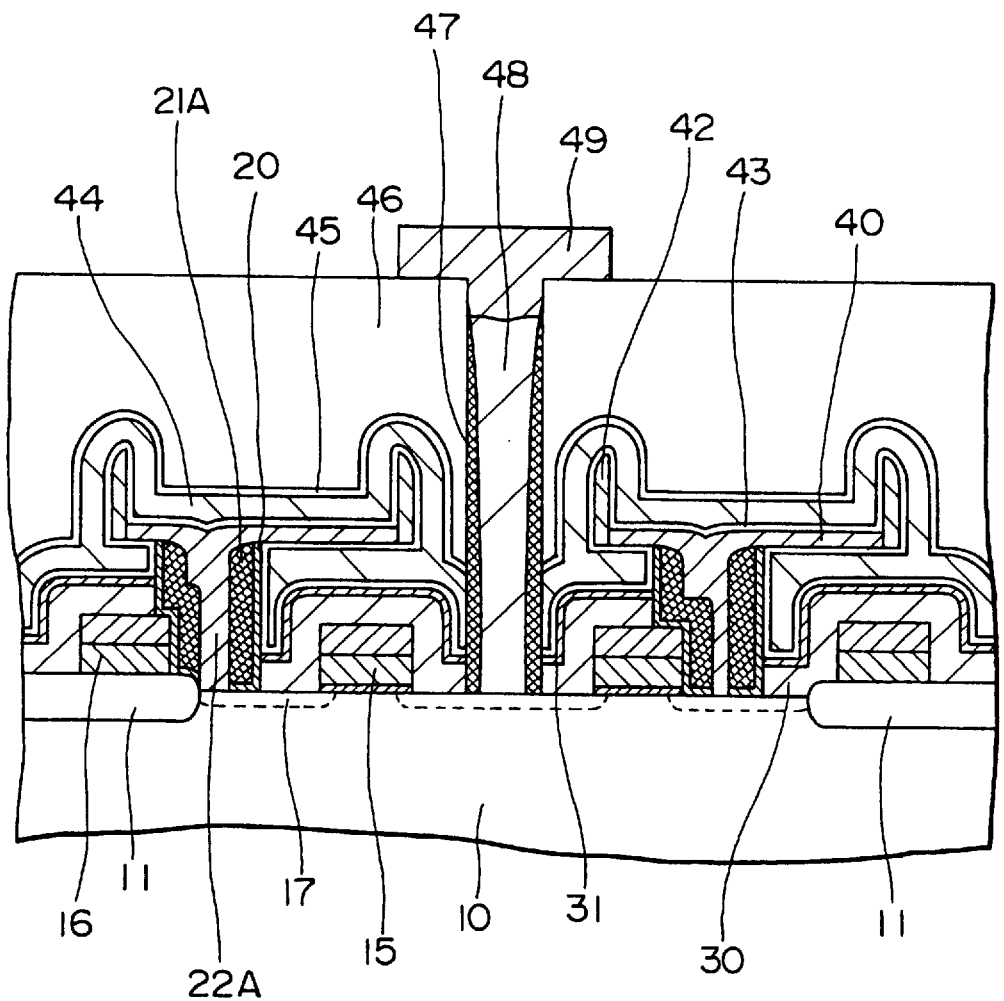
FIG. 5 is a schematic, partial sectional view of a semiconductor device in Embodiment 2.

The semiconductor device in this embodiment includes, as shown in FIG. 5, a diffusion layer 17 (as a conductive layer) formed in the semiconducting substrate 10 (as the base) made from silicon; interlayer insulating films 30, 31 and 32 formed on the diffusion layer 17; a connection hole formed in the interlayer insulating films 30, 31 and 32 at a position over the diffusion layer 17; a storage electrode having a first and second storage electrode layers 40, 42 which are formed over the interlayer insulating film 32 and connected to the connection hole; a capacitor insulating film 43 formed on the storage electrode; and a plate electrode 44 formed on the capacitor insulating film 43. The connection hole is buried with a polycrystalline silicon layer extending from the first storage electrode layer 40 constituting the storage electrode.

Hereinafter, this embodiment will be described with reference to FIG. 5, FIGS. 6A and 6B, FIGS. 7A and 7B, FIGS. 8A and 8B, FIGS. 9A and 9B, and FIGS. 10A and 10B, which are schematic, partial sectional views of a semiconducting substrate and the like, illustrating a fabrication process of a semiconductor device according to this embodiment.

[Step-200]

Figure 6A:
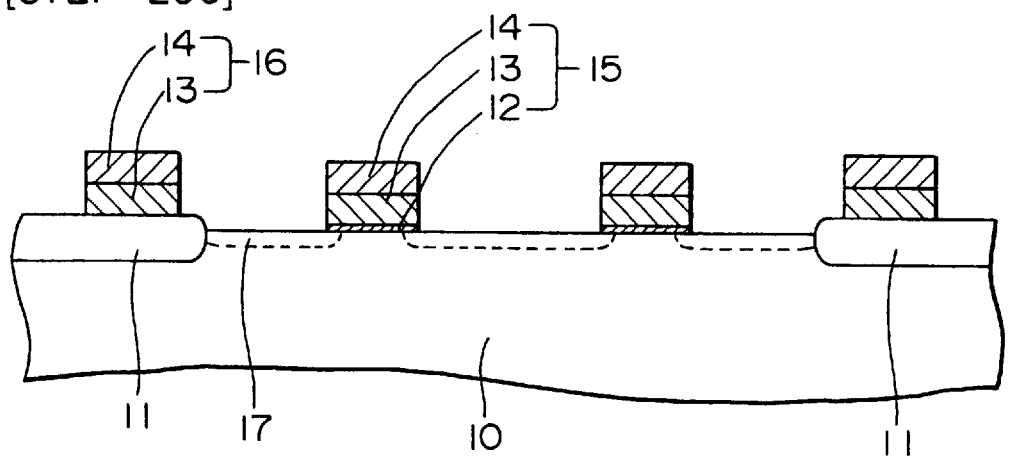
FIGS. 6A and 6B, FIG. 7A and 7B, FIGS. 8A and 8B, FIG. 9A and 9B, and FIGS. 10A and 10B are schematic, partial sectional views of a semiconducting substrate and the like, illustrating a fabrication process of the semiconductor device in Embodiment 2.
Figure 6B:
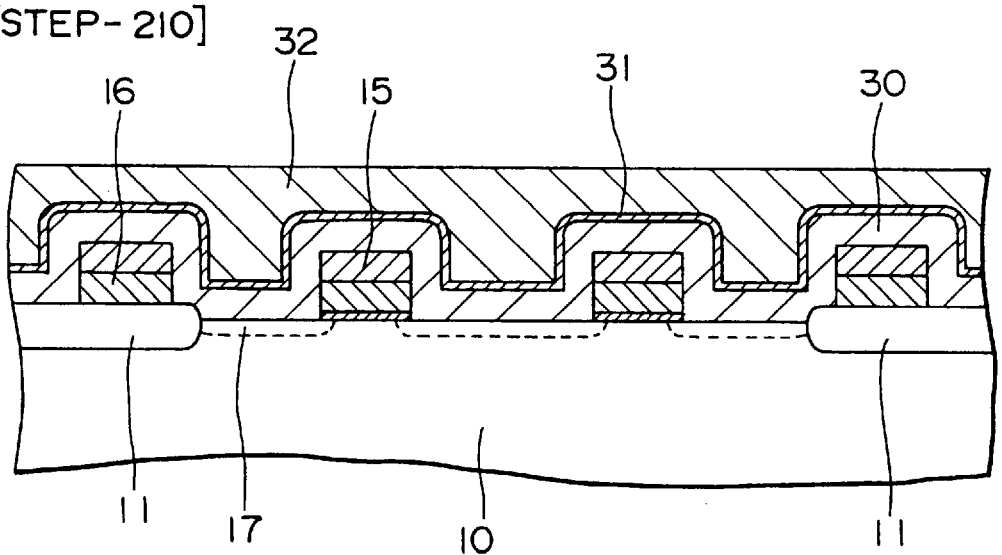

First, like Step-100 in the previous embodiment, an element isolation region 11 having a LOCOS structure, a gate oxide film 12, and a gate electrode 15 composed of a polycrystalline silicon layer 13 and a silicide layer 14 are formed on a semiconducting substrate 10 made from silicon. An interconnection layer 16 having a double layer structure of the polycrystalline silicon layer 13 and the polysilicide layer 14 is formed on the element isolation region 11, as required. After that, a diffusion layer 17 is formed in the semiconducting substrate 10 by ion implantation of an impurity in the semiconducting substrate 10. Such a structure is shown in FIG. 6A.

[step-210]

Figure 7A:
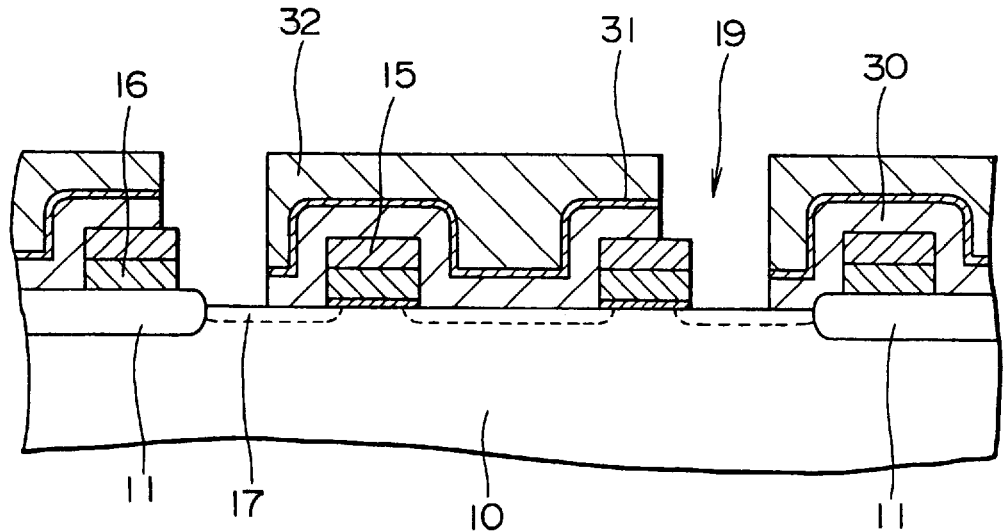

A first interlayer insulating film 30 (thickness: several hundred nm) made from SiO$_2$ is formed by CVD on the semiconducting substrate 10 (as the base) formed with the diffusion layer 17 (as the conductive layer); a second interlayer insulating film 31 (thickness: several ten nm) made from SiN is formed thereon by LP-CVD (Low Pressure CVD); and a third interlayer insulating film 32 (thickness: several hundred nm) made from BPSG (Boron Phospho Silicate Glass) is formed thereon by CVD. The third interlayer insulating film 32 made from BPSG is preferably planarized by heat treatment at a temperature of from 800° to 900° C. (see FIG. 6B). The planarization may be performed by etching-back or chemical-mechanical polishing. After that, an opening portion 19 is formed by RIE in the third, second and first interlayer insulating films 32, 31 and 30 at a position over the diffusion layer 17. Such a structure is shown in FIG. 7A. FIG. 7A shows a state in which there occurs misalignment.

[Step-220]

Figure 7B:
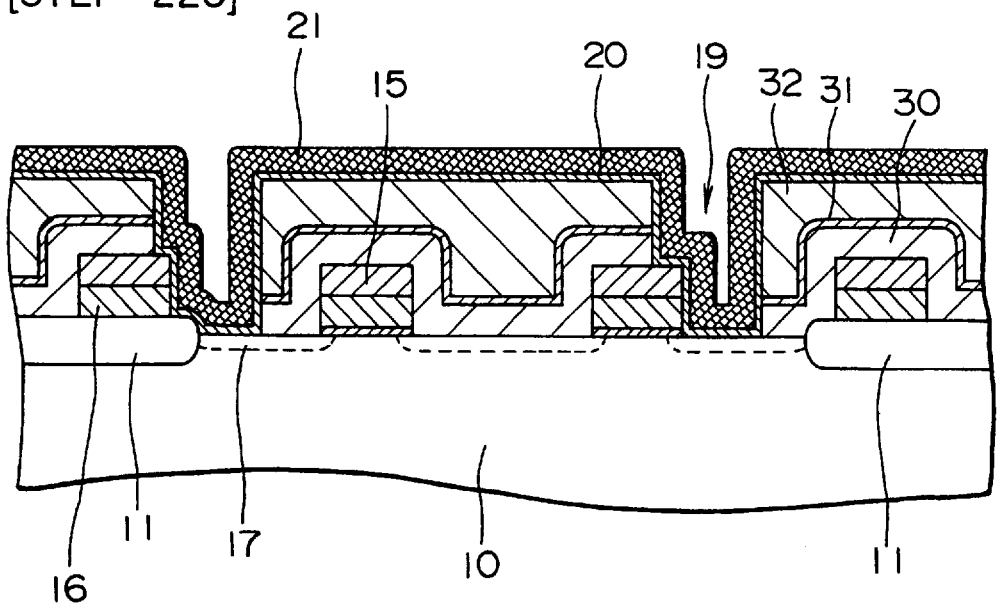

Like Step-120 in the previous embodiment, a SiN layer is formed on the third interlayer insulating film 32 including the interior of the opening portion 19 and a SiO$_2$ layer is formed thereon. Thus, an insulating film 20 having a double layer structure of the SiN layer and the SiO$_2$ layer is formed over the entire surface including the interior of the opening portion 19. Next, like Step-130 in the previous embodiment, a non-crystal silicon layer (polycrystalline silicon layer in this embodiment) 21 is formed on the insulating film 20 by CVD. Such a structure is shown in FIG. 7B. The insulating layer 20 is represented by one layer for a clearer understanding in FIG. 7B. The non-crystal silicon layer 21 is not necessarily doped with an impurity; however, it is preferably doped with an impurity.

[Step-230]

Figure 8A:
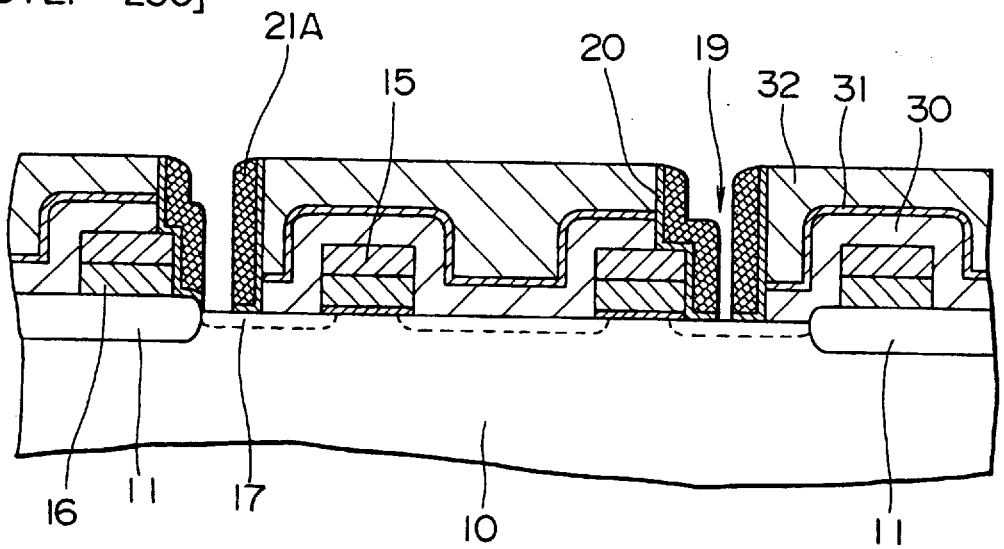

Like Step-140 in the previous embodiment, the non-crystalline silicon layer 21 and the insulating film 20 positioned on the third interlayer insulating film 32 and on the bottom portion of the opening portion 19 are anisotropically etched using a HBr/Cl$_2$ based etching gas, to form a side wall 21A made from non-crystal silicon on the insulating film 20 covering the inner wall of the opening portion 19. Since the insulating film 20 covering the inner wall of the opening portion 19 is covered with the side wall 21A made from non-crystalline silicon, it is not exposed to the etching gas. Moreover, the insulating film 20 on the bottom portion of the opening portion 19 is etched with the side wall 21A taken as a mask. Such a structure is shown in FIG. 8A. In addition, if the surface of the non-crystal silicon layer 21 is oxidized before etching to form a SiO$_2$ film on the surface of the non-crystal silicon layer 21, the non-crystal silicon layer 21 on the inner wall of the opening portion 19 becomes hard to be etched. This is effective to more positively form the side wall 21A.

[Step-240)]

Figure 8B:
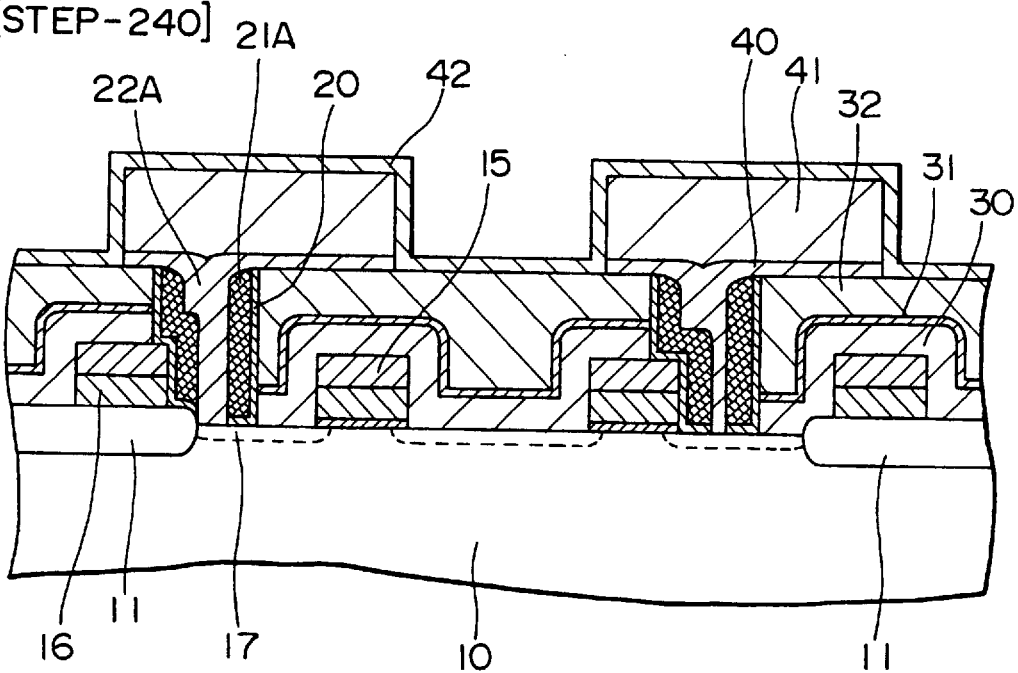
Figure 9A:
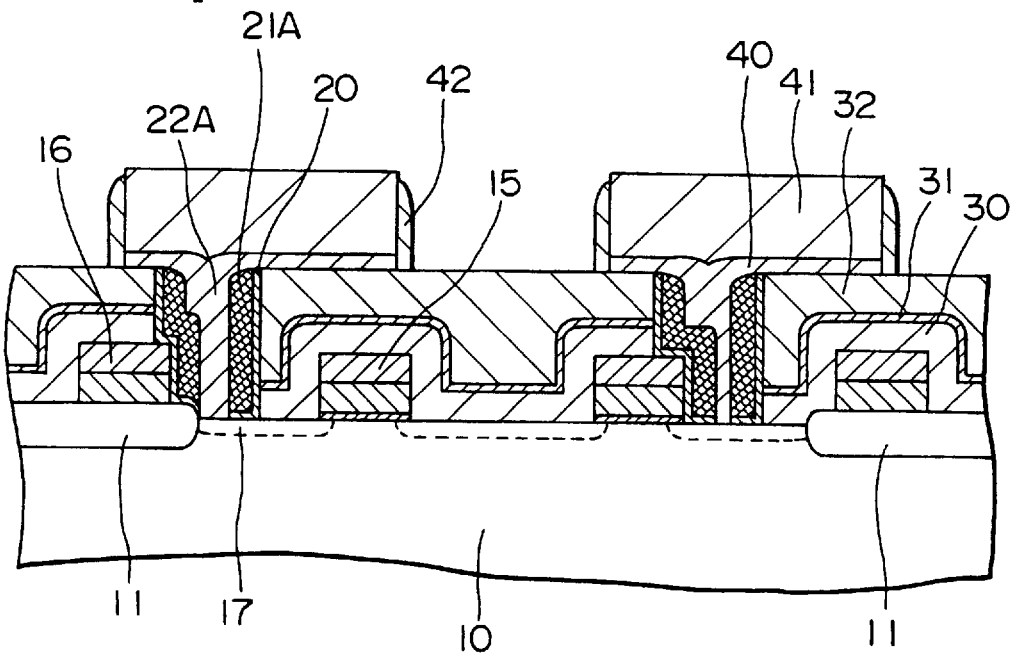
Figure 9B:
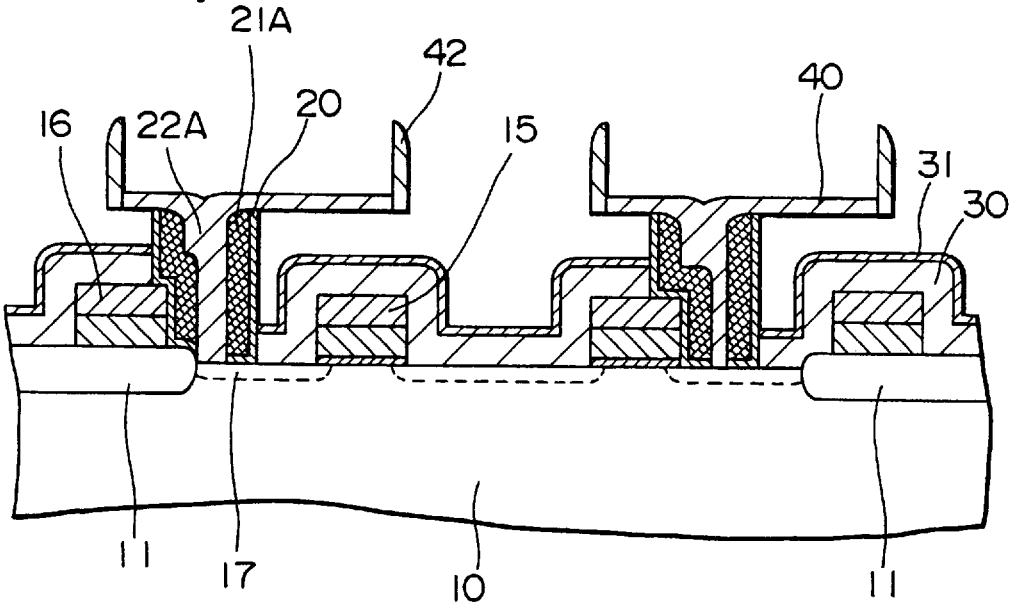

A polycrystalline silicon layer doped with an impurity is deposited by CVD on the third interlayer insulating film 32 including the interior of the opening portion 19, to bury the interior of the opening portion 19 with polycrystalline silicon as a conductive material. The opening portion 19 is thus buried with a contact plug 22A made from polycrystalline silicon, to accomplish a connection hole of the present invention. A first storage electrode layer 40 made from this polycrystalline silicon is formed on the third interlayer insulating film 32. An oxide film 41 (thickness: several hundred nm) made from SiO$_2$ is formed on the first storage electrode layer 40 by CVD. After that, the oxide film 41 and the first storage electrode layer 40 are anisotropically etched on the basis of a pattern of a storage electrode (storing node electrode). Subsequently, a second storage electrode layer 42 made from polycrystalline silicon doped with an impurity is formed by CVD over the entire surface to a thickness of from several ten nm to several hundred nm. Such a structure is shown in FIG. 8B.

[Step-250]

Next, after anisotropic etching of the second storage electrode layer 42 (see FIG. 9A), the oxide film 41 made from SiO$_2$ and the third interlayer insulating film 32 made from BPSG are removed by wet etching using the second interlayer insulating film 31 made from SiN as an etching stopper (see FIG. 9B), to thus form a cylindrical capacitor storage electrode (storing node electrode) composed of the first and second storage electrode layers 40, 42.

[Step-260]

Figure 10A:
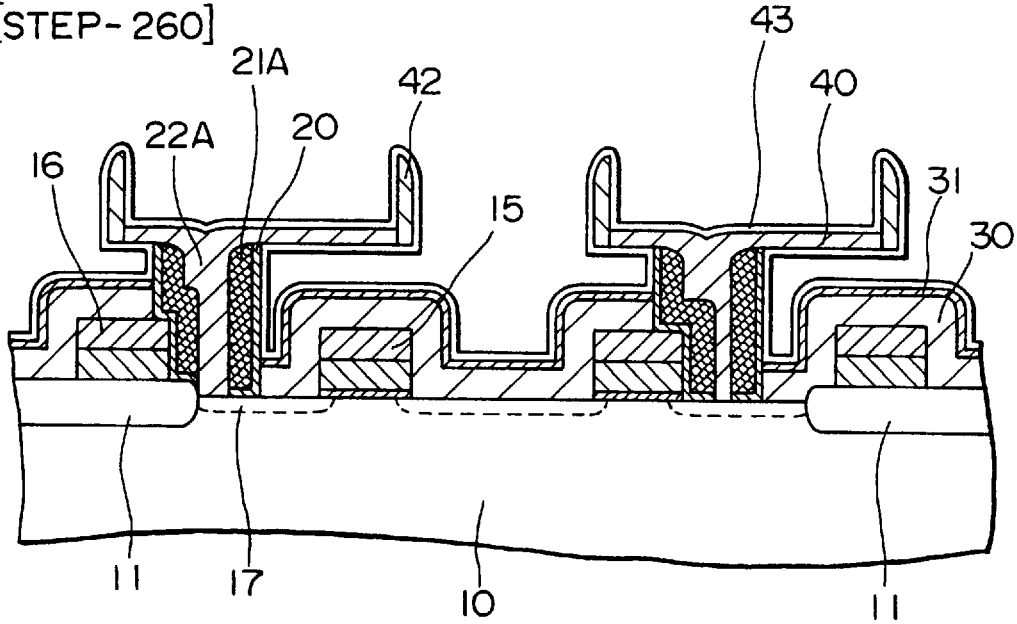

A capacitor insulating film 43 made from SiO$_2$ or SiN, or having an ONO (Oxide-Nitride-Oxide)structure is formed over the entire surface by CVD (see FIG. 10A).

[Step-270]

Figure 10B:
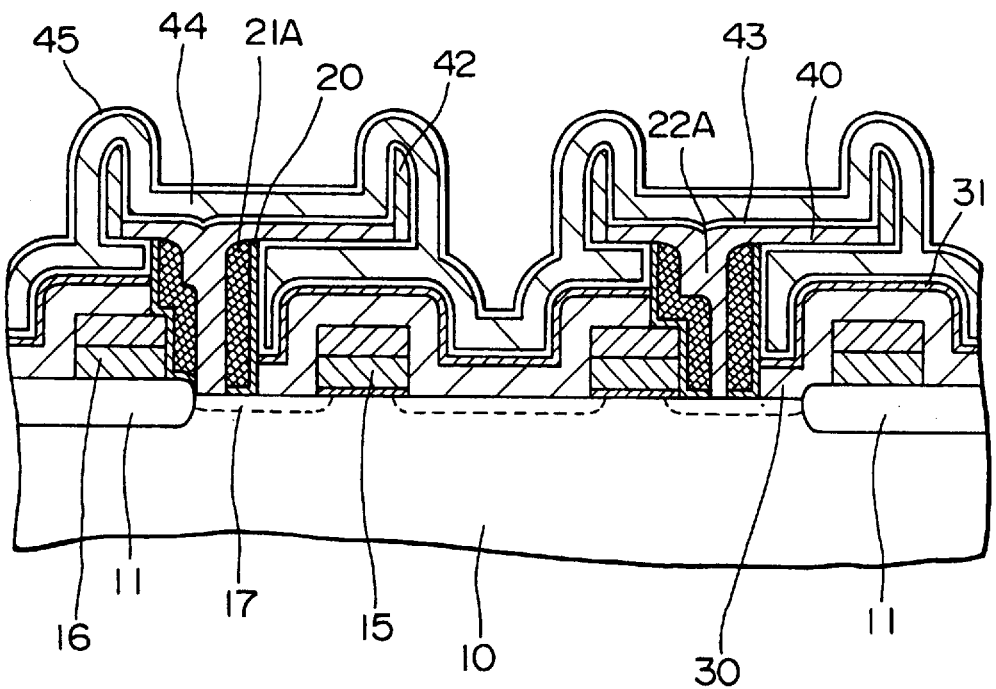

A polycrystaline silicon layer doped with an impurity is deposited over the entire surface by CVD to form a plate electrode 44 formed of the polycrystalline silicon layer, and a fourth interlayer insulating film 45 made from SiN is formed over the entire surface by LP-CVD (see Fig. 10B). The fourth interlayer insulating film 45 and the plate electrode 44 are patterned into a desired electrode shape by photolithography and etching, and the second interlayer insulating film 31 and the first interlayer insulating film 30 are then anisotropically etched.

[Step-280]

A fifth interlayer insulating film 46 is deposited over the entire surface by CVD, and is planarized by chemical-mechanical polishing. After that, the fifth interlayer insulating film 46, fourth interlayer insulating film 45, plate electrode 44, second interlayer insulating film 31, and first interlayer insulating film 30 are anisotropically etched, to form an opening portion. An insulating film (thickness: several ten nm) made from SiO$_2$, SiN or SiN/SiO$_2$ is deposited by CVD on the fifth interlayer insulating film 46 including the interior of the opening portion, and a non-crystal silicon layer (amorphous silicon layer or polycrystalline silicon layer) is deposited on the insulating film to a thickness of from several ten nm to several hundred nm. The non-crystal silicon layer may be doped with an impurity or not doped with an impurity. The non-crystal silicon layer and the insulating film are etched-back, to form a side wall 47 formed of the non-crystal silicon layer and the insulating film on the inner wall of the opening portion. The side wall 47 has the same structure as that of the side wall 21A in the previous embodiment. The side wall 47 is represented by one layer for a clearer understanding in the figure. In some cases, differently from the configuration of the side wall in the connection hole of the present invention, the side wall 47 may be formed by forming a Ti layer, TiN layer, Ti/TiN layer, W layer, or TiW layer on the insulating film by sputtering, in place of deposition of the non-crystal silicon layer on the insulating film. Alternatively, the formation of the non-crystal silicon layer, Ti layer or the like may be omitted.

The interior of the opening portion formed with the side wall 47 is buried with polycrystal silicon doped with an impurity, to form a bit contact 48. In place of burying the opening portion with polycrystalline silicon, the bit contact 48 may be formed using the blanket tungsten CVD process described in the previous embodiment.

Next, a Ti layer for improving wettability and an interconnection layer made from Al-0.5%Cu are formed over the entire surface by sputtering, like Step-160 in the previous embodiment. The interconnection layer and the Ti later are patterned by etching, to form an upper interconnection layer 49. Such a structure is shown in FIG. 5. The upper interconnection layer 49 is represented by one layer for a clearer understanding in this figure.

The above-described processing steps are followed by known steps, to accomplish a semiconductor device according to the present invention.

Although the preferred embodiments of the present invention have been described using specific terms, such description is for illustrative purposes only, and it is to be understood that the conditions in the processing steps described in the embodiments may be changed without departing from the spirit and scope of the invention.

Figure 11:
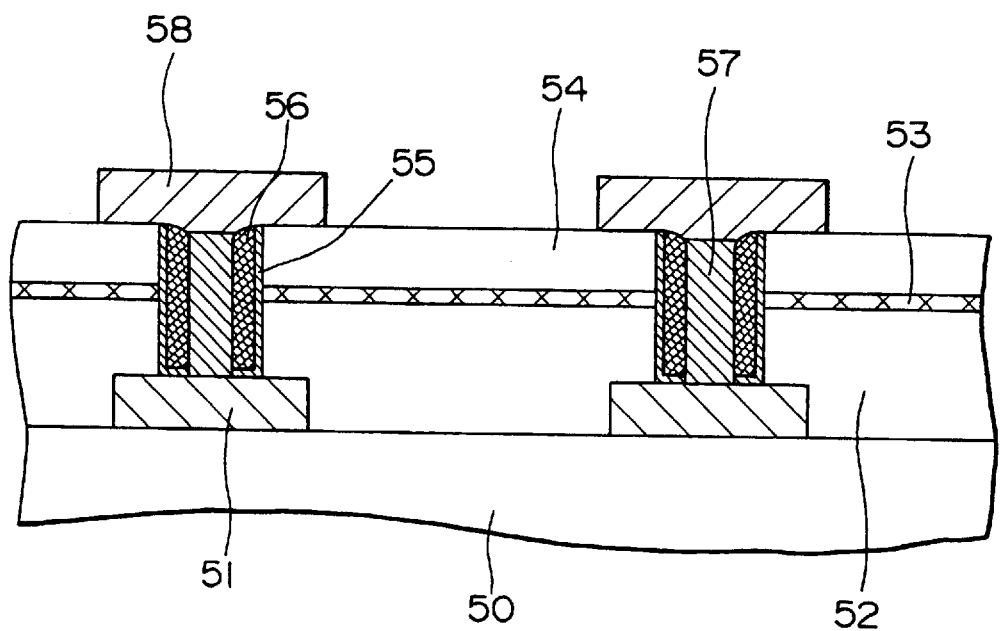
FIG. 11 is a schematic, partial sectional view of a connection hole and an interconnection structure of a semiconductor device formed in accordance with the inventive method of forming a connection hole of a semiconductor device, in the case where a base is an insulating layer and a conductive layer is a lower interconnection layer.
Figure 12A:
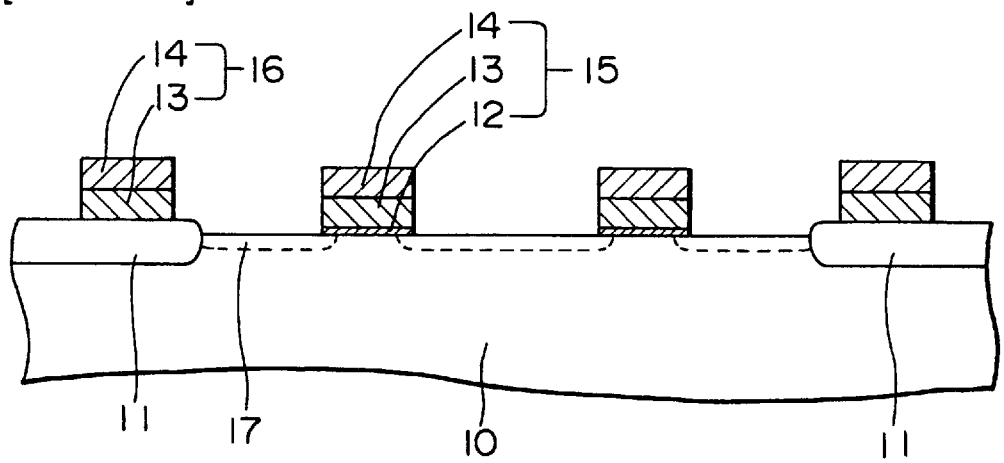
Figure 12B:
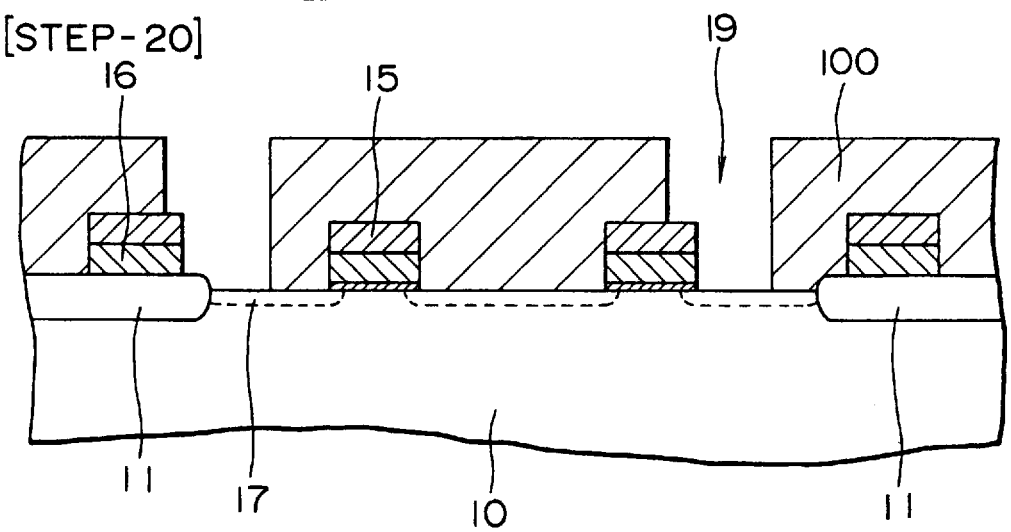
Figure 13A:
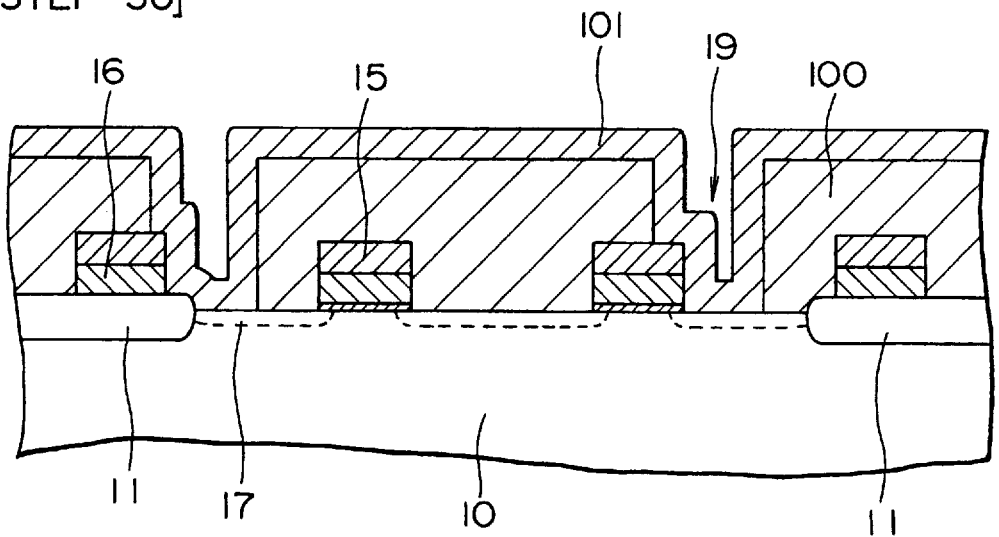
Figure 13B:
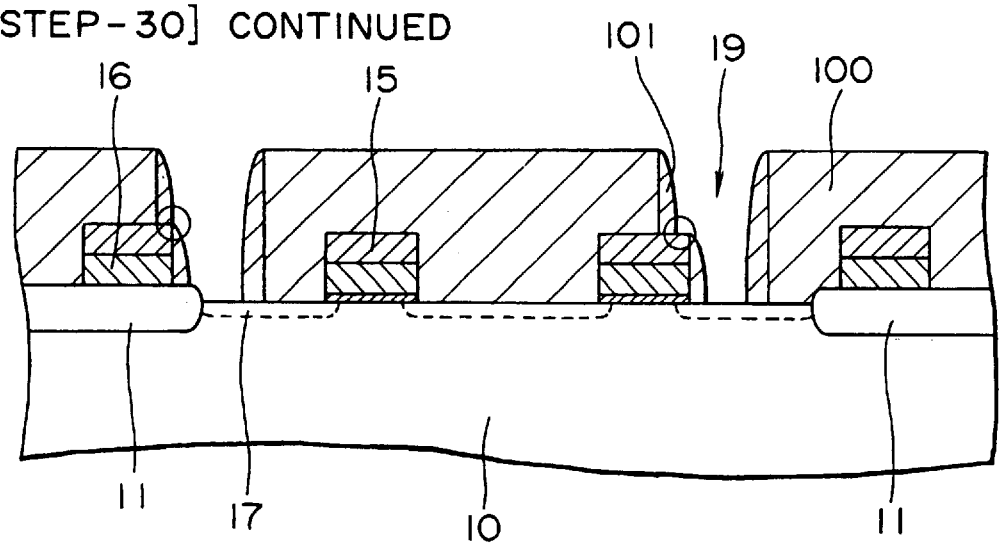

For example, the method of forming a connection hole of a semiconductor device according to the present invention can be applied to the case shown in FIG. 11 in which the base is an insulating layer 50 and the conductive layer is a lower interconnection layer 51. In the structure shown in FIG. 11, an insulating layer 52, intermediate interconnection layer 53 and an insulating layer 54 are formed on the lower interconnection layer 51 and the insulating film 50. A connection hole is formed in the insulating layer 52, intermediate layer 53, and insulating layer 54 at a position over the lower interconnection layer 51. An insulating film 55 protected by a side wall 56 made from non-crystal silicon is formed on the inner wall of the connection hole. The interior of the opening portion is buried with a contact plug 57 made from an interconnection material such as polycrystalline silicon doped with an impurity, a high melting point metal, or an aluminum alloy. The intermediate interconnection layer 53 is electrically insulated from the contact plug 57 by means of the insulating film 55. An upper interconnection layer 58 connected to the connection hole is provided on the insulating layer 54. The formation of the connection hole can be performed in the same manner as described in the previous embodiment, and therefore, detail description thereof is omitted.

The opening portion may be buried with a different metal or a high melting point metal, in place of blanket tungsten CVD. For example, a contact plug or a bit contact made from copper or aluminum may be formed by forming a copper or aluminum layer by CVD. The formation condition of the copper layer by CVD is as follows.

Film Formation Condition of Copper Layer process gas: $Cu(HFA)_2/H_2=10/1000$ scam pressure: $2.6 \times 10^3$ Pa substrate heating temperature: 350° C.

power: 500 W

In addition, HFA is the abbreviation for hexafluoroacetylacetonate.

The TiN layer and Ti layer may be formed by CVD in the following conditions, in place of formation by sputtering.

ECR-CVD Condition of Ti Layer process gas: $TiCl_4/H_2=10/50$ sccm microwave power: 2.18 kW temperature: 420° C.

pressure: 0.12 Pa

ECR-CVD Condition of TiN Layer process gas: $TiCl_4/H_2/N_2=20/26/8$ sccm microwave power: 2.8 kW substrate RF bias: −50 W temperature: 420° C.

pressure: 0.12 Pa

The aluminum alloy forming the upper interconnection layer may include pure aluminum, Al—Si, Al—Si—Cu, Al—Ge and Al—Si—Ge, in addition to Al—Cu. Each of the interlayer insulating film may be made from a known insulating material such as $SiO_2$, BPSG, PSG, BSG, AsSG, PbSG, SbSG, NSG, SOG, LTO (Low Temperature Oxide, Low temperature $CVD-SiO_2$), SiN, or SiON in the form of a single or laminated structure, as required.

What is claimed is:

1. An interconnection structure of a semiconductor device, comprising:

a conductive layer formed on a base;

an interlayer insulating film formed on said conductive layer, said interlayer insulating film having a connection hole formed therethrough and extending from said conductive layer to a top surface of said interlayer insulating film;

an upper interconnection layer formed on said top surface of said interlayer insulating film;

a connector insulating film formed on an inner wall of said connection hole; and a non-crystal silicon side wall formed over said connector insulating film.

2. An interconnection structure of a semiconductor device according to claim 1, wherein said connector insulating film is a double layer structure of a SiN layer and a $SiO_2$ layer.

3. An interconnection structure of a semiconductor device according to claim 1, wherein said non-crystal silicon side wall is a polysilicon layer.

4. An interconnection structure of a semiconductor device according to claim 1, further comprising:

a $SiO_2$ film formed on a surface of said non-crystal silicon side wall.

5. A semiconductor device comprising:

a conductive layer formed on a base;

an interlayer insulating film formed on said conductive layer, said interlayer insulating film having a connection hole formed therethrough and extending from said conductive layer to a top surface of said interlayer insulating film;

a storage electrode formed at a position over said top surface of said interlayer insulating film;

a capacitor insulating film formed on said storage electrode;

a plate electrode formed on said capacitor insulating film;

a connector insulating film formed on an inner wall of said connection hole; and a non-crystal silicon side wall formed over said connector insulating film.

6. A semiconductor device according to claim 5, wherein said connector insulating film is a double layer structure of a SiN layer and a $SiO_2$ layer.

7. A semiconductor device according to claim 5, wherein said non-crystal silicon side wall is a polysilicon layer.

8. A semiconductor device according to claim 5, further comprising:

a $SiO_2$ film formed on a surface of said non-crystal silicon side wall.

* * * * *